(12) United States Patent
Haase

(10) Patent No.: US 6,700,392 B2
(45) Date of Patent: Mar. 2, 2004

(54) DIGITAL MEASUREMENT CIRCUIT AND SYSTEM USING A GROUNDED CAPACITIVE SENSOR

(76) Inventor: Wayne C. Haase, 7 Matthew La., Sterling, MA (US) 01564

(*) Notice: Subject to any disclaimer, the term of this patent is extended or adjusted under 35 U.S.C. 154(b) by 15 days.

(21) Appl. No.: 10/062,677

(22) Filed: Jan. 31, 2002

(65) Prior Publication Data

US 2002/0140440 A1 Oct. 3, 2002

Related U.S. Application Data

(60) Provisional application No. 60/266,151, filed on Feb. 2, 2001.

(51) Int. Cl.$^7$ ............................................. G01R 27/26
(52) U.S. Cl. .................... 324/674; 324/684; 324/678
(58) Field of Search ................. 324/674, 678, 324/681, 688, 677, 686, 663, 684

(56) References Cited

U.S. PATENT DOCUMENTS

| | | | |
|---|---|---|---|
| 4,187,460 A | 2/1980 | Dauge et al. | 324/678 |
| 4,339,709 A | 7/1982 | Brihier | 324/725 |
| 5,589,802 A | 12/1996 | O'Shaughnessy | 331/44 |
| 5,952,835 A | 9/1999 | Covely | 324/671 |
| 6,307,385 B1 * | 10/2001 | Tardif et al. | 324/678 |

* cited by examiner

*Primary Examiner*—John E. Chapman
*Assistant Examiner*—James Kerveros (74) *Attorney, Agent, or Firm*—Weingarten, Schurgin Gagnebin & Lebovici LLP (57) ABSTRACT

A circuit and system for sensing and measuring the mutual capacitance between a sensor capacitor having one grounded lead and a target and providing a direct digital output of the measured capacitance is disclosed. The circuit and system includes a relaxation oscillator coupled to a sensor capacitor and a fixed resistor. The fixed resistor and the sensor capacitor in conjunction with the relaxation oscillator provide a time varying output signal that has a period that is proportional to the mutual capacitance of the sensor capacitor and a target and resistance of the fixed resistor. The circuit and system can also include circuitry to compensate for the input capacitance of one or more amplifiers used in the relaxation oscillator. The circuit and system can also include circuitry to effectively increase the resistance of the fixed resistor by a predetermined constant. This allows a smaller resistance value for the fixed resistor to be used with the concomitant reduction in the size of the fixed resistor, which reduces the parasitic capacitance of the fixed resistor. A guard electrode can be formed coaxially surrounding the fixed resistor and coupled to an input amplifier in the circuit to further reduce the parallel parasitic capacitance of the fixed resistor. An interval timer can be coupled to the output of the relaxation oscillator to provide an accurate measurement of the period of the output signal. This value, or the frequency of the output signal, may be used by a calculation module to accurately determine the value of the mutual capacitance and the value of the measured variable. In addition, the system may include predetermined calibration signals that are used as correction values.

32 Claims, 5 Drawing Sheets

DIGITAL MEASUREMENT CIRCUIT AND SYSTEM USING A GROUNDED CAPACITIVE SENSOR

CROSS REFERENCE TO RELATED APPLICATIONS

This application claims priority under 35 U.S.C. §19(e) to provisional patent application Ser. No. 60/266,151 filed Feb. 2, 2001; the disclosure of which is incorporated by reference.

STATEMENT REGARDING FEDERALLY SPONSORED RESEARCH OR DEVELOPMENT

N/A

BACKGROUND OF THE INVENTION

This invention relates to capacitive measurement circuits and systems for measuring the mutual capacitance of a sensing capacitor and a target, and in particular to capacitive measurement circuits and systems where the sensing capacitor has one terminal that is grounded.

Capacitive based sensing and measurement systems measure the mutual electrical capacitance between a sensing capacitor and a target. Capacitive sensors are able to directly sense conditions that directly affect the value of the mutual capacitance between the sensor capacitor and the target. For example, the proximity or distance between a metal object and a capacitor electrode can be directly determined by measuring the mutual capacitance therebetween. In addition, the change in mutual capacitance can be used to determine the rate at which the metal object is moving toward or away from the sensor. The proximity of a non-conductive target can be directly sensed as the value of the capacitance of the sensor capacitor changes due to the proximity, or distance between, the non-conductive target changing the dielectric constant of the sensor capacitor over air. These sensors can be used, for example, in clearance measurement systems for sensing the proximity of a target to a sensor capacitor, such as fast moving turbine blades to a wall, wherein the capacitive sensor is contained flush with the wall surface. Additionally, the thickness of a known dielectric material or the dielectric constant of a material of a known thickness may be directly measured by capacitive sensors.

Capacitance sensors may measure other phenomena indirectly where the phenomenon to be sensed or measured is converted into a motion or changes a dielectric constant between the sensor capacitor and the target that may be directly measured capacitively. For example, the target may be a pressure transducer that includes a diaphragm, having stable deflection properties, that is deflected toward or away from the sensing capacitor by a change in pressure. Fluid flow may also be measured where the flow is converted into a pressure or a displacement that can be measured as described above. Similarly, temperature may be determined if the target moves toward or away from the sensing capacitor due to changes in temperature.

Many prior art systems used a non-grounded sensing capacitor. A non-grounded sensing capacitor is one that has both leads accessible to the user for measuring the desired quantity. One advantage of using non-grounded sensor capacitors is that many circuits exist for measuring the value of the capacitance when both leads are available. However, one lead of the capacitor must be grounded in some situations, for example, situations in which the target is electrically grounded. Such a target can include rotating shafts and jet engine turbine blades wherein the distance or proximity to the target is measured. This is the situation in many distance-measuring situations since the target, which is one lead of the capacitor, is usually not isolated from ground. However, the ease of measuring capacitance is not as straightforward when one lead of the capacitor is grounded.

Capacitance-based clearance measurement systems generally are either static or dynamic in operation. Dynamic measurement systems typically do not measure the capacitance between the target and the sensing capacitor directly. Rather dynamic systems measure the change in capacitance between the target and the sensing capacitor. These prior art systems typically apply a constant voltage to the sensing capacitor and measure the change in capacitance due to the motion of the target towards and away from the sensing capacitor. Accordingly, a dynamic system is unable to provide an indication of the clearance of a target from the sensor if the value of the capacitance is constant and therefore is able to provide measurements only if the capacitance is continuously changing.

Static systems typically measure the capacitance between the sensing capacitor and the target by applying a time-varying voltage, such as a sinusoidal voltage, to the sensing capacitor and measuring the resultant current. Conversely, the capacitance between the sensing capacitor and the target may be determined by applying a time-varying current, such as a sinusoidal current, to the sensing capacitor and measuring the resultant voltage. Other prior art techniques determine the capacitance between the sensing capacitor and the target by measuring the resonant frequency of the sensing capacitor and an inductor of a known value.

The desired measurement quantity also further complicates the use of grounded sensor capacitors. For example, the capacitance, C, between a circular plate of area A and a grounded target, separated by air of dielectric constant $\in$, is related to the distance, d, between the plate and the target (neglecting fringing) by the equation, $$C = \in A/d \qquad (1)$$

Accordingly, the distance between the sensor and the target is inversely related to capacitance, i.e., as expressed in equation (1), the relationship between C and d is non-linear. If the effects of fringing of the electric field are also included, then the relationship is even more complex. In this case in which an inverse relationship between the measured quantity and the capacitance exists it may be advantageous to measure the reciprocal of the capacitance. However, this severely restricts the sensor circuit options available.

Static systems that drive the sensing capacitor with a time varying signal often use a specially designed transformer. These transformers can be expensive and be large enough to affect, detrimentally, the package size of the sensor. In addition, the accuracy of the sensing circuit is dependent upon properly calibrating the circuit for the particular characteristics of the transformer used to drive the circuit. As the transformer characteristics change, the sensing circuit will become less accurate unless the calibration is performed again.

Static systems may also use a diode bridge circuit to develop a rectified analog output signal that results from the drive signal applied to the sensing capacitor. The accuracy of the capacitance measurement system is dependent upon proper calibration for the specific diodes used within the bridge circuitry. These diode characteristics may change over time and are likely to change with respect to temperature and to temperature differences between the sensor and the individual diodes. In addition, the diodes include a parasitic junction capacitance that may be temperature dependent as well. Thus, calibrating the capacitance measuring system for use with the diode bridge is a complex matter that may need to be repeated over multiple temperatures and over time. This complex calibration procedure will require more processing power and memory storage than simpler techniques.

Often distance measuring transducers or pressure measuring transducers are parts of larger systems, which also employ other sensors and actuators. For example, both types of transducers, distance and pressure, are used in automotive control systems, such as engine control computers and anti-lock braking systems. Similarly, both types of transducers are used in semiconductor fabrication equipment. The information from a distance or pressure measurement transducer is often provided to a digital system, such as a microprocessor or computer for processing. Accordingly, an analog-to-digital converter (A/D) must be added to the system to convert the output signal into a digital format further increasing the complexity, cost, and parts count of the system. Furthermore, the use of A/D's often degrades the performance of the transducer by introducing conversion errors and time delays. Therefore, what is needed is a circuit and system for accurately measuring the capacitance of a grounded sensor capacitor that is low cost, light weight, physically small, and that provides for a linear relationship between the output signal and the value of the sensed capacitance and provides a digital output without requiring the use of analog-to-digital converters (A/D's).

BRIEF SUMMARY OF THE INVENTION

A circuit and system for sensing and measuring the mutual capacitance between a sensor capacitor having one grounded lead and a target and providing a direct digital output of the measured capacitance is disclosed. The circuit and system includes a relaxation oscillator coupled to a sensor capacitor and a fixed resistor. The fixed resistor and the sensor capacitor in conjunction with the relaxation oscillator provide a time varying output signal that has a period that is proportional to the mutual capacitance of the sensor capacitor and a target and resistance of the fixed resistor. In addition, the frequency of the output signal is inversely proportional to the mutual capacitance of the sensor capacitor and target. The circuit and system can also include circuitry to compensate for the input capacitance of one or more amplifiers used in the relaxation oscillator. The circuit and system can also include circuitry to effectively increase the resistance of the fixed resistor by a predetermined constant. This allows a smaller resistance value for the fixed resistor to be used with the concomitant reduction in the size of the fixed resistor, which reduces the parasitic capacitance of the fixed resistor. A guard electrode can be formed coaxially surrounding the fixed resistor and coupled to an input amplifier in the circuit to further reduce the parallel parasitic capacitance of the fixed resistor. An interval timer can be coupled to the output of the relaxation oscillator to provide an accurate measurement of the period of the output signal. This value, or the frequency of the output signal, may be used by a calculation module to accurately determine the value of the mutual capacitance, or the reciprocal of the mutual capacitance, and the value of the measured variable. In addition, the system may include predetermined calibration signals that are used as correction values.

In one embodiment, the circuit and system includes a first amplifier having an input and an output, the input connected to the first terminal of the sensing capacitor. The amplifier provides an output signal that is proportional to the input signal that is used to drive a Schmitt trigger, the Schmitt trigger having first and second threshold values defining a hysteresis input to the Schmitt trigger. The Schmitt trigger is configured and arranged to switch an output signal between the first and second output values as a function of the input signal and the first and second threshold values. In particular, the output of the Schmitt trigger is the first output level when the input exceeds the second threshold level, in a positive sense. Similarly, the output of the Schmitt trigger is the second output level when the input exceeds the first threshold level in a negative sense. The Schmitt trigger maintains the previous output whenever the input is between the two threshold levels. The circuit and system further includes a fixed resistor connected in series between the output of the Schmitt trigger and the first terminal of the sensing capacitor. The output signal of the Schmitt trigger has first and second values, wherein the output of the Schmitt trigger is the first value for the first relaxation time and the output of the Schmitt trigger is the second value for a second relaxation time. The sum of the first relaxation time and the second relaxation time is proportional to the capacitance of the sensor capacitor. The first and second relaxation times of the output signal are a function of the capacitance of the sensor capacitor and the resistance of the fixed resistor.

Other forms, features and aspects of the above-described methods and system are described in the detailed description that follows.

BRIEF DESCRIPTION OF THE SEVERAL VIEWS OF THE DRAWING

The invention will be more fully understood by reference to the following Detailed Description of the Invention in conjunction with the Drawings of which.

DETAILED DESCRIPTION OF THE INVENTION

Figure 1:
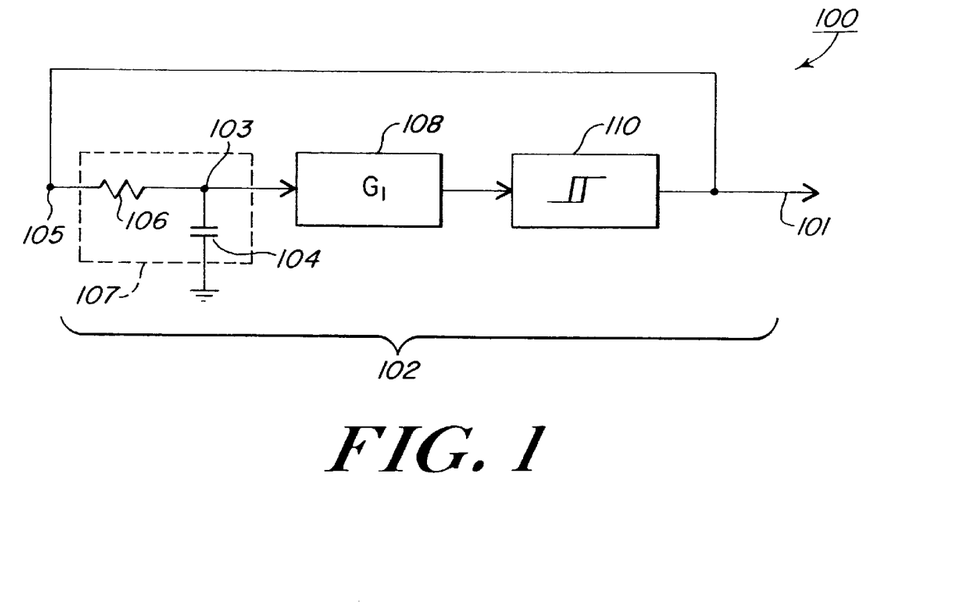
FIG. 1 is a block diagram of a relaxation oscillator for providing an output signal proportional to the capacitance of a sensor capacitor.

FIG. 1 depicts a circuit for determining the value of the mutual capacitance between a sensor capacitor and a target. FIG. 1 depicts a circuit 100 that includes a relaxation oscillator 102 that provides a time varying output signal 101 that has a period proportional to the value of the mutual capacitance between a sensing capacitor 104 and a target. In general, the changes in the mutual capacitance depend upon the orientation and proximity of the target (not shown) relative to the sensor capacitor. The relaxation oscillator 102 includes a fixed resistor 106 that is used to charge the sensing capacitor 104 and sets the period of the time varying signal. The relaxation oscillator 102 further includes a first amplifier coupled to the fixed resistor 106 and the sensing capacitor 104 at node 105, wherein the first amplifier 108 provides an output to a Schmitt trigger 110. The Schmitt trigger 110 provides the output signal 101 having first and second output levels, Va and Vb respectively, both as an output signal and as a feedback signal to the first terminal of the fixed resistor 106 at node 103. The Schmitt trigger 110 includes first and second threshold levels $Va_{tha}$ and $V_{thb}$ that correspond to the first and second output levels Va and Vb respectively, and provide the hysteresis at the input of the Schmitt trigger 110.

In operation if the Schmitt trigger 110 is at the first output level, $V_a$, the Schmitt trigger 110 responds to a rising input that exceeds the upper threshold, $Va_{tha}$, by changing the output to the second output level, $V_b$. Similarly, when the Schmitt trigger 110 is at the second output level, $V_b$, the Schmitt trigger 110 responds to a falling input that exceeds, in a negative sense, the lower threshold, $V_{thb}$, by changing the output to the first output level, $V_a$. As the output signal 101 changes, the sensor capacitor charges toward the first output level or discharges toward the second output level out of phase with the output signal 101. This out of phase signal provides an out of phase input to the Schmitt trigger 110 necessary for oscillation to occur.

Figure 2:
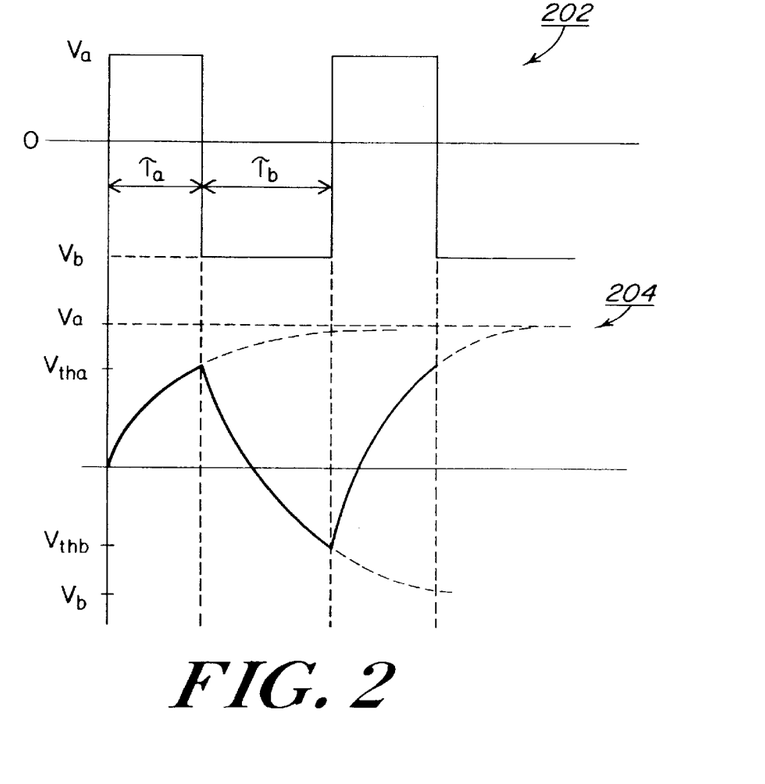
FIG. 2 is a graph of two waveforms describing the operation of the relaxation oscillator in FIG. 1.

FIG. 2 depicts waveforms 202 and 204 that illustrate the operation of the system depicted in FIG. 1. As discussed above, assume that when the power is first applied to the system, the output signal provided by the Schmitt trigger 110 is at the first output level, $V_a$ as depicted in waveform 202. The sensor capacitor 104 begins to charge from 0 toward $V_a$ as depicted in waveform 204. The sensor capacitor 104 charges with a time constant of RC, where R is the resistance of the fixed resistor 106 and C is the capacitance of the sensing capacitor 104. When the sensing capacitor has charged to a value equal to the first threshold value $V_{tha}$, the Schmitt trigger 110 will change the output signal to the second output level, $-V_b$ as depicted in waveform 204. The length of time $\tau_a$ that the output is at $V_a$ depends upon the value of $V_a$, the threshold value $Va_{tha}$, the value of the fixed resistor 106 and the value of the sensor capacitor C. When the output has changed to $-V_b$ the sensing capacitor 104 begins to discharge from $Va_{tha}$ toward $-V_b$ with the same time constant as above. When the sensing capacitor has charged to a value equal to the second threshold value $-V_{thb}$, the Schmitt trigger will change the output signal to the first output level, $V_a$. The length of time $\tau_b$ that the output is at $-V_b$ depends upon the value of $-V_b$, the threshold value $V_{thb}$, the value of the fixed resistor 106 and the value of the sensor capacitor C. The sensing capacitor 106 then begins charging from $-V_{thb}$ toward $V_a$ with the time constant equal to RC. If at power up, the output signal 101 is at the second output level, $-V_b$, the same oscillatory action will occur since the relaxation oscillator is a self-starting oscillator. Thus, the period of the output signal of the Schmitt trigger is equal to $\tau_a + \tau_b$ and is proportional to the value of the capacitance of the sensor capacitor 104.

Figure 3:
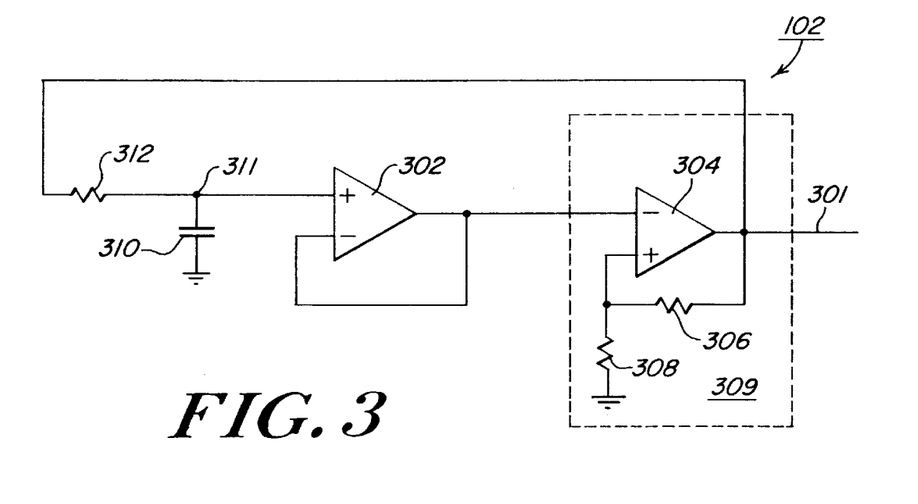
FIG. 3 is a schematic diagram of a relaxation oscillator corresponding to the block diagram of FIG. 1.

FIG. 3 depicts a circuit that is suitable for use as a relaxation oscillator 102. In particular, circuit 102 includes a first op-amp 302 configured as a non-inverting unity gain amplifier having an input coupled to the junction of the fixed resistor 312 and the sensing capacitor 310 at node 311. The output of the op-amp 302 unity gain amplifier is provided to the negative input of a comparator 304 that is a part of a Schmitt trigger 309. The comparator 304 provides the output signal 302 at the first and second levels $V_a$ and $V_b$ respectively in response to the signal input level received from the amplifier 302. The Schmitt trigger 309 includes the comparator 304 and the associated feedback resistors 306 and 308. The feedback resistors 306 and 308 are configured and arranged as a voltage divider and provide a portion of the output signal 302 to the positive input of the comparator 304 setting the threshold level of the comparator 304. The resistors 306 and 308 are selected such that the portion of the output signal 302 provided to the positive input of the comparator 304 is equal to the first threshold $V_{tha}$ for the first output level $V_a$. Similarly, the resistors will provide the portion of the output signal 302 to positive input that is equal to the second threshold level $-V_{thb}$ for the second output level $-V_b$. Thus, for the circuit depicted in FIG. 3

$$\tau_a = RC^* \ln(1 + (R3/R2) + (R3V_b/(R2V_a))) \text{ and}$$

$$\tau_b = RC^* \ln(1 + (R2/R3) + (R2V_a/(R3V_b)))$$

The first and second output levels $V_a$ and $-V_b$ and the first and second threshold values $V_{tha}$ and $-V_{thb}$ can be set to an arbitrary value depending on the system requirements for a particular application. The system requirements, which include the range of capacitance of the sensor capacitor 310, are also used to determine the values of the fixed resistor that is used to set the first and second relaxation periods.

Figure 4:
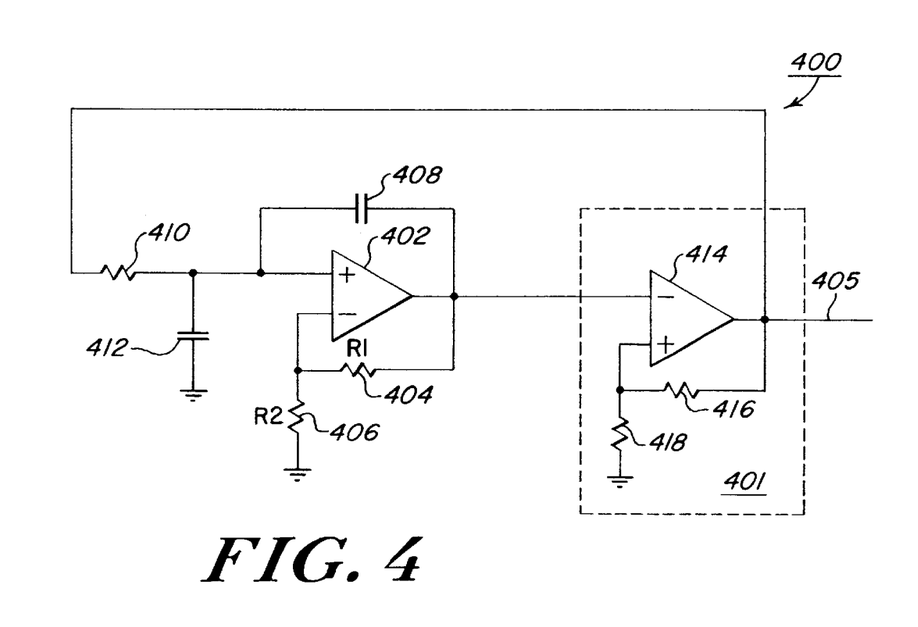
FIG. 4 is a schematic of a relaxation oscillator circuit that provides for compensation of the input capacitance of an amplifier used therein.

Typically, the sensing capacitor used in the embodiments described herein is in the range of 0.01 pF to 100 pF. The input capacitance of a typical op-amp used in these embodiments, such as a AD549 electrometer amplifier by Analog Devices, Norwood Mass. has an input capacitance of 0.8 pF. Since the input capacitance is of the same order of magnitude as the sensing capacitor, the input capacitance must be reduced in order not to interfere with the measurement of the sensing capacitor. FIG. 4 depicts a circuit that reduces the effect of the input capacitance of the op-amp. The circuit 400 depicted in FIG. 4 includes a Schmitt trigger 401 including a comparator 414 and feedback resistors 416 and 418 that is configured as described above with respect to FIG. 3. Op-amp 402 includes a resistor voltage divider providing feedback between the output of the op-amp 402 and the negative input in a non-inverting amplifier configuration with gain. The op-amp 402 further includes a feedback capacitor 408 coupled between the output of the op-amp 402 and the positive input of the op-amp 402. This feedback capacitor configuration reduces the effective input capacitance of the by an amount of negative capacitance equal to $C_f(R1/R2)$, where $C_f$ is the value of the feedback capacitor, R1 is the value of resistor 404, and R2 is the value of resistor 406.

In one embodiment, the value of a feedback capacitor $C_f$ and the values of the of the resistors 404 and 406, or both are adjusted to provide a predetermined amount of negative capacitance. The predetermined amount of negative capacitance can be used to compensate for the input capacitance of the op-amp 402. Alternatively, the values of the feedback capacitor $C_f$ and the resistors 404 and 406 can be adjusted to overcompensate or to undercompensate for the input capacitance of the op-amp 402. This variable compensation provides a low level linearizing term that can be used to compensate for other non-linear components. For example, the relationship between the deflection of a rigid diaphragm and applied pressure for a pressure transducer is slightly non-linear and may be compensated for by the proper selection of the amount of over or under compensation.

Figure 12:
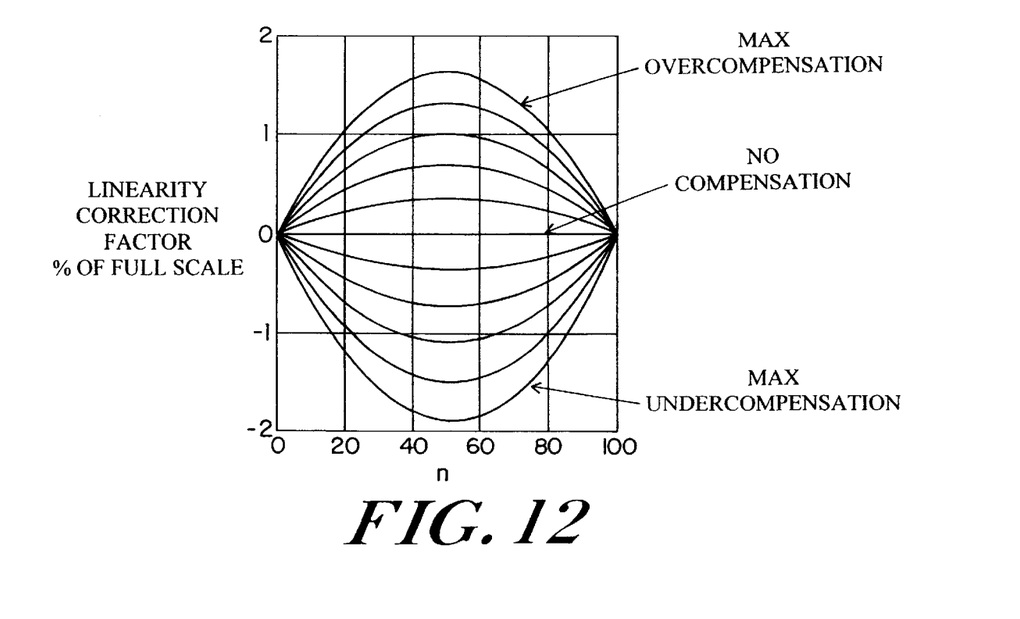
FIG. 12 depicts plot of the effect on linearity due to over/under compensation of amplifier input capacitance.

FIG. 12 illustrates the effects of over/under compensation. The graph of FIG. 12 indicates that a sense capacitor with a nominal value of 1 pico Farad capacitance at a nominal gap of 0.005 inches, and operating over the range of 0.005 inches to 0.012 inches, can have a linearity correction factor ranging from approximately −1.5% of full scale to 1.5% of full scale. This can be achieved by over- or undercompensating by an equivalent factor of 0.05 pico Farads. As the graph of FIG. 12 illustrates, the correction factor is approximately quadratic in nature.

Figure 5:
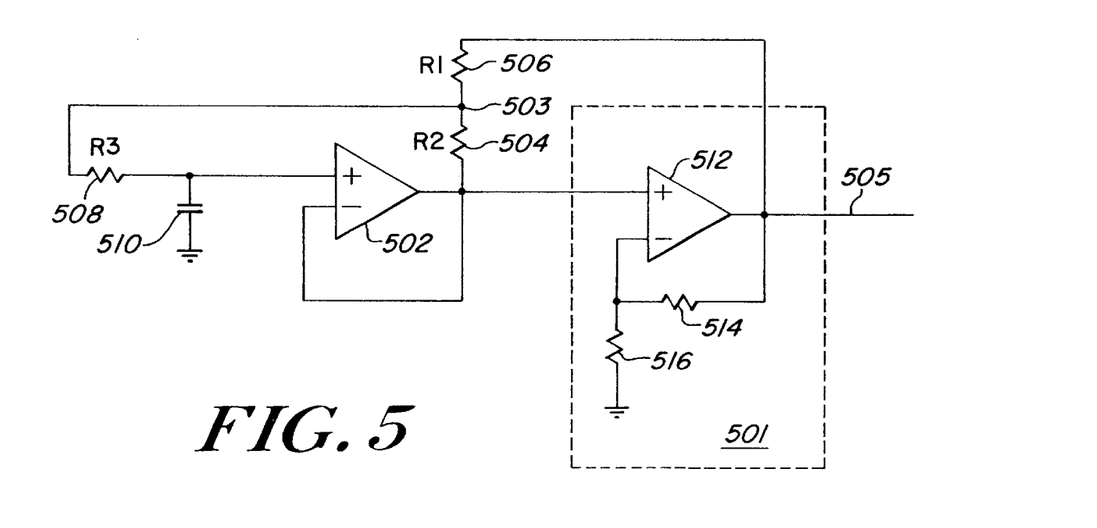
FIG. 5 is a schematic diagram of a relaxation oscillator circuit that provides for multiplying the fixed resistor of FIG. 1 by a predetermined amount to reduce value of the resistance of the fixed resistor.

Since the values of the sensing capacitors are so small, the fixed resistor must have a large resistance value to provide for a reasonable time constant in the output signal. Typically, the value of the fixed resistor in each of the embodiments described herein is typically in the range of one Megaohm to several hundred Megaohms. Resistance values in the range of hundreds of Megaohms are not only difficult to obtain but are often unstable in the value of their resistance over both time and temperature. FIG. 5 depicts a schematic of a circuit that is suitable for multiplying the value of the fixed resistor such that a lower value resistor, which is likely to be more stable, may be used as the fixed resistor 508. FIG. 5 depicts a circuit 500 that includes a Schmitt trigger 501 that includes a comparator 512 and resistors 514 and 516 that is configured as described above with respect to FIG. 3. The circuit 500 further includes an op-amp 502 and resistors 504 and 506. Resistors 504 and 506 are connected in series between the output of the comparator 512 and the output of the op-amp 502. Node 503 at which the two resistors 506 and 504 are connected to one another is connected to the fixed resistor 508. The sensing capacitor 510 is connected as described above. This configuration allows the value of the fixed resistor 508 to be multiplied by the ratio of the resistances of resistor 506 to resistor 504, as in R(R1/R2), where R is the resistance of the fixed resistor 510, R1 is the resistance of resistor 506 and R2 is the resistance of resistor 504. By the proper selection of ratio of R1 and R2, resistors 506 and 504 respectively, the resistance of the fixed resistor can be increased by several orders of magnitude. Accordingly, the value of the fixed resistor may be concomitantly smaller by several orders of magnitude, thus having a resistance that is more easily obtained and more stable.

Figure 6:
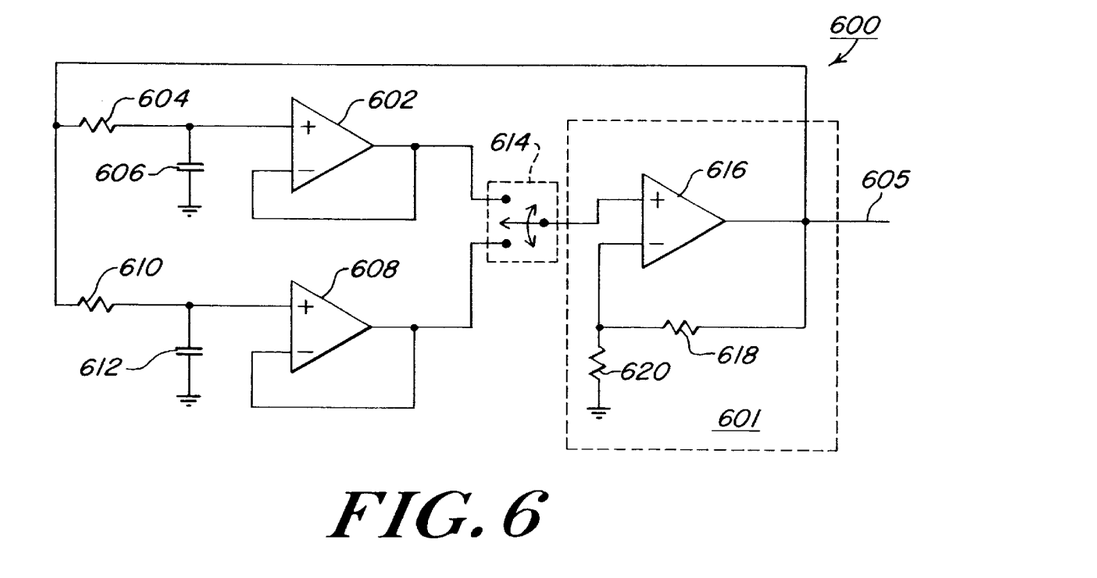
FIG. 6 is a schematic diagram of a relaxation oscillator circuit that provides for measuring more than one sensor capacitor.

This effect is illustrated by comparing the value of the time constants in the circuits depicted in FIG. 3 and FIG. 5. The time constant for the circuit of FIG. 3 was shown above to be RC, where R is the value of fixed resistor 312 and C is the value of sensor capacitor 310. For the circuit of FIG. 5, the time constant for the circuit is (Req)(C), where C is the value of the sensor capacitor 510 and Req is described by the equation:

$$Req = R1 + R3 + (R1)(R3)/(R2)$$

and where R1 is the value of resistor 506, R2 is the value of resistor 504, and R3 is the value of resistor 508. In some instances more than one sensor capacitor is used, for example when two or more sensor capacitors are used in a differential sensor configuration. When more than one sensor capacitor is used, each of the capacitors is buffered by a separate amplifier and each of the separate amplifiers can be switched to a single Schmitt trigger. The circuit depicted in FIG. 6 illustrates two sensor capacitors having two buffer amplifiers connected thereto. Although only two sensor capacitors are shown, any number may be used. In the embodiment depicted in FIG. 6 a first fixed resistor 604 is coupled to a first sensor capacitor 606 and the first op-amp 602 that is configured as a buffer amplifier. Similarly, a second fixed resistor 610 is coupled to a second sensor capacitor 612 and the second op-amp 608 that is configured as a buffer amplifier. The outputs of the first and second op-amps, 602 and 608 respectively, are coupled to a multi-pole switch 614 that in the illustrated embodiment is a single pole single throw (SPST) switch. The output of the SPST switch is provide to a Schmitt trigger 601 that includes a comparator 616 and resistors 618 and 620 that is configured as described above with respect to FIG. 3. The output 605 of the comparator 616 is provided to both of the fixed resistors 604 and 610. By controlling the position of the SPST switch 614 the corresponding fixed resistor and sensor capacitor determine the first and second relaxation times of the output signal. Thus, each of the two capacitors can be determined separately and the difference, sum, or other mathematical function of the two or more capacitors may be determined. For example, in certain pressure transducers, the measured variable is a function of the difference between the reciprocals of the capacitance of each capacitor. In addition, the techniques discussed with respect to FIGS. 4 and 5 can be used with each of the sensor capacitors in FIG. 6 depending on the system requirements. Alternatively, under certain conditions a single buffer amplifier could be switched between two sensor capacitors 606 and 612 by placing the SPDT switch at the input side of the buffer amplifier. However, the SPDT switch should have an input capacitance that is less than the sensor capacitors 606 and 612; otherwise, this embodiment will perform poorly when compared to the switched embodiment depicted in FIG. 6 and described above.

Figure 7:
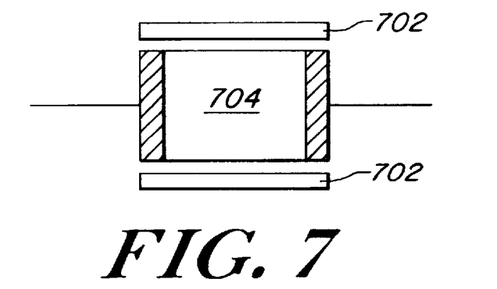
FIG. 7 is cross section of a fixed resistor and a guard electrode.
Figure 8:
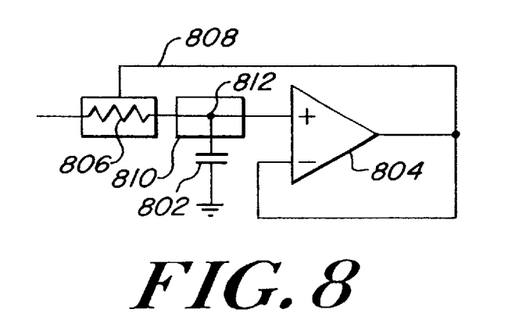
FIG. 8 is a schematic diagram of an amplifier providing compensation of the parasitic capacitance of the fixed resistor.

Virtually all resistors contain parasitic capacitance that is typically in the range of 0.1 pF to 5 pF depending on the construction of the resistor. The problem can be exacerbated by the use of small, surface mounted resistors due to the close proximity of the two end plates of the resistor. FIG. 7 depicts a guard electrode 702 surrounding the resistive material 704 that makes up the fixed resistor in a configuration that may be used to effectively eliminate this parasitic parallel capacitance. As depicted in FIG. 8, the guard electrode 814 is electrically connected to the output of the op-amp amplifier 804 that is coupled to the fixed resistor 806 and sensor capacitor 806. By driving the fixed resistor 806 from the output of the comparator comprising the Schmitt trigger as discussed above, and driving the guard electrode 814 from the output of op-amp 802, the parasitic. parallel capacitance of the fixed resistor can be virtually eliminated. Also as shown in FIG. 8 a connection to an additional guard, guard 810 that surrounds the input lead of amplifier 804 and one lead of the sense capacitor 802 can also be provided. Guard 810 is commonly employed in prior art to eliminate the effect of additional stray capacitance that appears between node 812 and ground. In this embodiment, guard electrode 814 and guard electrode 810 can be combined into a single guard structure. It is important to note, however, that the function of guard electrode 814 is substantially different from that of guard electrode 810.

Figure 9:
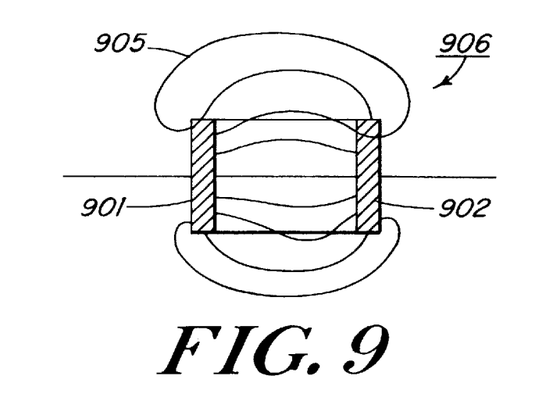
FIG. 9 depicts an electric field of a fixed resistor used in the embodiments described herein.
Figure 10:
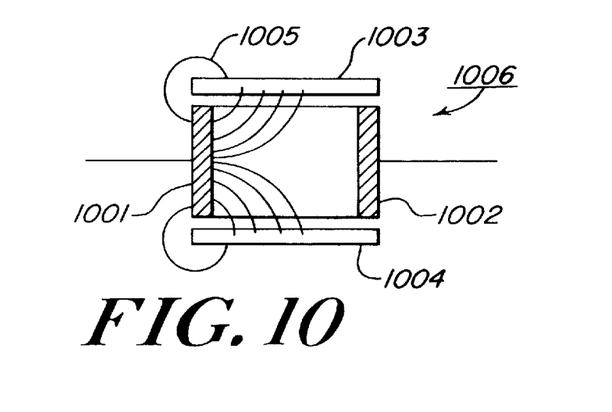
FIG. 10 depicts an electric field of a fixed resistor depicted in FIG. 9 in conjunction with a guard electrode.

The mechanism by which the guards substantially reduce the parasitic, parallel capacitance is illustrated in FIGS. 9 and 10. FIG. 9 depicts an unguarded resistor 906. Assume that terminal 901 of resistor 906 is at a different voltage potential relative to terminal 902. In this case, electric field lines, 905, will originate on terminal 901 and terminate on terminal 902. As a result of this electric field, a parasitic capacitance is formed that is parallel to resistor 906. Note that some of the capacitance is due to fringing electric field lines that pass outside of the structure of the resistor 906.

In contrast FIG. 10 depicts a guarded resistor. Resistor 1006 is surrounded by guard electrode 1003, which is driven at the same potential voltage as terminal 1002. Assume that terminal 1001 is a higher potential voltage than terminal 1002. In this case, electric field lines 1005 originate on terminal 1001, but do not terminate on terminal 1002. Instead, the field lines 1005 terminate on the guard electrode 1003 due to the close proximity of the guard electrode 1003 to electrode 1001. Although a parasitic capacitor is generated this parasitic capacitance is not in parallel with resistor 1006. Rather, the parasitic capacitance appears between terminal 1001 and the guard electrode 1003. The only effect of this new parasitic capacitance is to provide an increased load on both the op-amp and the comparator. The op-amp and the comparator are both low output impedance devices, and therefore the effect of the additional loading is negligible. This reduces the effective value of the parasitic parallel capacitance across the resistor to the order 0.01 pF or less.

The output of the Schmitt trigger in each of the embodiments described is inherently a digital output and therefore can be provided to an interval timer or counter for processing. FIG. 9 depicts an embodiment of a sensor capacitor measurement system that includes a relaxation oscillator 902 having an input coupled to a sensor capacitor 904 and an output coupled to a counter/timer module 906. The relaxation oscillator can be that depicted in FIGS. 3, 4, 5 or 6 or a combination of the techniques described with respect to each of the embodiments illustrated in the corresponding figures.

Alternatively, the relaxation oscillator could be an available integrated circuit such as a 555 integrated circuit, or the relaxation oscillator could be constructed using a negative resistance device such as a unijunction transistor as is known in the art. However, these circuits would require an input buffer amplifier to have an input capacitance that is less than the value of the sensor capacitor.

Figure 11:
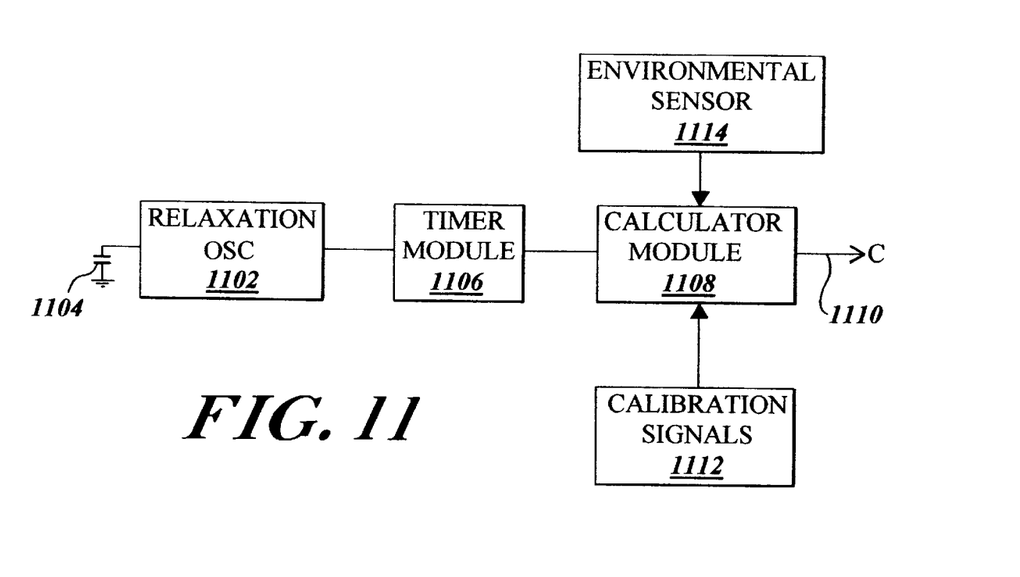
FIG. 11 is a block diagram of system for measuring and calculating the capacitance of the sensor capacitor.

The output of the relaxation oscillator, as described above consists of a first pulse having a first relaxation time $\tau_a$ and a second pulse having a second relaxation time $\tau_b$. Thus, the sum of the first and second relaxation times, $\tau_a+\tau_b$ is equal to the period of the oscillator and is proportional to the value of the sense capacitor. Accordingly, the frequency of the oscillator must be inversely proportional to the value of the sense capacitor. Therefore, either the period, or the frequency of the oscillation may be determined from the first and second relaxation times $\tau_a$ and $\tau_a$. If the desired quantity that is being measured is proportional to the capacitance value, the period can be used in the subsequent calculations by the calculator module 908. Similarly, if the desired quantity that is being measured is inversely proportional to the capacitance value, the frequency can be used in the subsequent calculations by calculation module 908. Alternatively, if an analog output signal is desired, an digital-to-analog converter (DAC) (not shown) can be coupled to the output of the digital counter to provide an analog voltage that is indicative of the measured capacitance value.

Furthermore, the use of calculation module 1108 allows for any linearity corrections can be made prior to providing the output. In addition, correction factors such as those due to environmental conditions such as temperature, pressure, and humidity can be included in the calculation. For example, environmental sensors 1114 could provide temperature, pressure and humidity data to the calculation module 1108, and pre-determined correction factors could be applied to the capacitance measurement before providing an output signal 1110.

In another embodiment, the circuit and system described herein can be calibrated by a calibration module 1112 providing calibration signals to the calculation module 1108. In general, one or more predetermined levels of the phenomena to be measured are provided to the circuit and the output signal are recorded as corresponding calibration signals. These calibration signals can be used as correction factors by the calculation module. For example, if the transducer is a distance-measuring device, if the distance between the capacitive sensor and the target were to be stepped through specific positions and the calibration signals were to inform the calculation module 1108 when the distance was at a specific location, then the calculation module 1108 could calculate and store internally the algebraic correction factors to provide an output of increased linearity and increased calibration. Similarly, if the transducer were a pressure transducer, the capacitive sensor could be set to a predetermined set of specific pressures and the calculation module could calculate and store internally the algebraic correction factors to provide an output of increased linearity and calibration.

Those of ordinary skill in the art should further appreciate that variations to and modification of the above-described apparatus and system for sensing and measuring the capacitance of a grounded sensor capacitor may be made without departing from the inventive concepts disclosed herein. Accordingly, the invention should be viewed as limited solely by the scope and spirit of the appended claims.

What is claimed is:

1. A circuit for sensing the value of the mutual capacitance between a sensor capacitor and a target, the circuit comprising:

a sensing capacitor having a sensing capacitance value, the sensing capacitor having first and second terminals, the second terminal coupled to a voltage reference point;

a first amplifier having an input and an output, the input connected to the first terminal of the sensing capacitor, the amplifier providing an output signal that is proportional to the input signal;

an input capacitance compensation circuit coupled between the input and output of the first amplifier, the input capacitance compensation circuit operative to reduce the effect of the parasitic input capacitance of the first amplifier;

a relaxation oscillator coupled to the first amplifier and receiving the output signal therefrom, the relaxation oscillator including the sensing capacitor and the first amplifier, the relaxation oscillator having an output including first and second values, wherein the output of the relaxation oscillator is the first value for a first relaxation time and the output of the relaxation oscillator is the second value for a second relaxation time, and wherein the sum of the first relaxation time and the second relaxation time is proportional to the sensing capacitance value.

2. The circuit of claim 1, wherein the relaxation oscillator includes:

a Schmitt trigger having an input coupled to the output of the first amplifier and receiving the output signal therefrom as an input signal, the Schmitt trigger having first and second threshold values defining a hysteresis input to the Schmitt trigger, the Schmitt trigger configured and arranged to Switch an output signal between the first and second output values as a function of the input signal and the first and second threshold values, wherein the output is the first output level when the input exceeds the second threshold level, in a positive sense, and the output is the second output level when the input exceeds the first threshold level, in a negative sense, and wherein the Schmitt trigger maintains the previous output when the input is between the first and second thresholds;

a fixed resistor connected in series between the output of the Schmitt trigger and the first terminal of the sensing capacitor, wherein the first and second relaxation times are a function of the capacitance of the sensor capacitor and the resistance of the fixed resistor;

whereby the output signal of the Schmitt trigger has first and second values, wherein the output of the Schmitt trigger is the first value for the first relaxation time and the output of the Schmitt trigger is the second value for a second relaxation time, and wherein the sum of the first relaxation time and the second relaxation time is proportional to the first capacitance.

3. The circuit of claim 2 wherein the first amplifier includes an operational amplifier configured as a non-inverting unity gain amplifier.

4. The circuit of claim 2 wherein the Schmitt trigger includes a comparator having a positive input and a negative input and an output, wherein the input of the Schmitt trigger is the negative input, the Schmitt trigger further including a first resistor connected in series between the output and the positive input and a second resistor connected between the positive input and the voltage reference point, wherein the first and second resistors are selected to provide the first and second threshold values corresponding to the first and second output levels respectively.

5. The circuit of claim 2 further including a guard electrode coaxially surrounding the fixed resistor and proximate thereto, the guard being electrically coupled to the output of the first amplifier.

6. The circuit of claim 5 wherein the guard electrode further surrounds the input of the first amplifier.

7. The circuit of claim 1 wherein the first amplifier includes an operational amplifier and first and second resistors configured as a non-inverting amplifier in which the first and second resistors provide feedback form the output of the operational amplifier and the negative input, the non-inverting amplifier further including a feedback capacitor coupled between the output of the operational amplifier and the positive input.

8. A system for measuring the capacitance of a sensing capacitor, the system comprising:

a sensing capacitor having first and second terminals, the second terminal being connected to a voltage reference point, the sensing capacitor having a first capacitance;

a first amplifier having an input and an output, the input connected to the first terminal of the sensing capacitor, the amplifier providing an output signal that is proportional to the input signal;

an input capacitance compensation circuit coupled between the input and output of the first amplifier, the input capacitance compensation circuit operative to reduce the effect of the parasitic input capacitance of the first amplifier a relaxation oscillator coupled to the output of the first amplifier, the relaxation oscillator having an output including first and second values, wherein the output of the relaxation oscillator is the first value for a first relaxation time and the output of the relaxation oscillator is the second value for a second relaxation time, and wherein the sum of the first relaxation time and the second relaxation time is proportional to the first capacitance;

a timing module coupled to the relaxation oscillator and configured and arranged to measure the first and second relaxation times and to provide a total relaxation time that is the sum of the first and second relaxation times;

a calculation module coupled to the timing module and configured and arranged to calculate the first capacitance by multiplying the total relaxation time by a predetermined constant.

9. The system of claim 8 wherein the relaxation oscillator includes:

a Schmitt trigger having an input coupled to the output of the first amplifier and receiving the output signal therefrom as an input signal, the Schmitt trigger having first and second threshold values, the Schmitt trigger configured and arranged to switch an output signal between first and second output values as a function of the input signal and the first and second threshold values, wherein the output is the first output level when the input exceeds the second threshold level and the output is the second output level when the input exceeds the first threshold level;

a fixed resistor connected in series between the output of the Schmitt trigger and the first terminal of the sensing capacitor;

wherein the output of the Schmitt trigger is the first value for the first relaxation time and the output of the Schmitt trigger is the second value for a second relaxation time, and wherein the sum of the first relaxation time and the second relaxation time is proportional to the first capacitance.

10. The system of claim 9 wherein the predetermined constant is a function of the first ad second values and the first and second threshold values.

11. The system of claim 9 wherein the Schmitt trigger includes a comparator having a positive input and a negative input and an output, wherein the input of the Schmitt trigger is the positive input, the Schmitt trigger further including a first resistor connected in series between the output and the negative input and a second resistor connected between the negative input and the voltage reference point, wherein the first and second resistors are selected to provide the first and second threshold values.

12. The system of claim 9 further including a guard electrode coaxially surrounding the fixed resistor and proximate thereto, the guard being electrically coupled to the output of the first amplifier.

13. The system of claim 12 wherein the guard electrode further surrounds the input of the first amplifier.

14. The system of claim 8 wherein the first amplifier includes an operational amplifier configured as a unity gain amplifier.

15. The system of claim 8 wherein the first amplifier includes an operational amplifier and first and second resistors configured as a non-inverting amplifier in which the first and second resistors provide feedback form the output of the operational amplifier and the negative input, the non-inverting amplifier further including a feedback capacitor coupled between the output of the operational amplifier and the positive input.

16. The system of claim 8 further including a calibration module coupled to the calculation module, the calibration module providing predetermined calibration signals to the calculation module for use as correction facto s.

17. A circuit for sensing the value of the mutual capacitance between a sensor capacitor and a tar et, the circuit comprising:
   a sensing capacitor having a sensing capacitance value, the sensing capacitor having first and second terminals, the second terminal coupled to a voltage reference point;
   a first amplifier having an input and an output, the input connected to the first terminal of the sensing capacitor, the amplifier providing an output signal that is proportional to the input signal;
   a relaxation oscillator coupled to the first amplifier and receiving the output signal therefrom, the relaxation oscillator including the sensing capacitor and the first amplifier, the relaxation oscillator having an output including first and second values, wherein the output of the relaxation oscillator is the first value for a first relaxation time and the output of the relaxation oscillator is the second value for a second relaxation time, and wherein the sum of the first relaxation time and the second relaxation time is proportional to the sensing capacitance value;
   a fixed resistor connected in series between the output of the relation oscillator and the first terminal of the sensing capacitors wherein the first and second relaxation times are a functions of the capacitance of the sensor capacitor and the resistance of the fixed resistor;
   a resistance multiplying circuit coupled between the output of the relaxation oscillator, the output of the first amplifier and the fixed resistor, of the resistance multiplier circuit operative to multiply the value of the fixed resistor by a predetermined constant.

18. The circuit of claim 17 wherein the resistance multiplying circuit includes the first amplifier including an operational amplifier configured and arranged as a unity gain amplifier having an output and an input, the multiplying circuit further including first and second resistors coupled in series between the output of the relaxation oscillator and the output of the operational amplifier, the fixed resistor coupled to the series connection between the first and second resistors.

19. The circuit of claim 17 wherein the relaxation oscillator includes:
   a Schmitt trigger having an input coupled to the output of the first amplifier and receiving the output signal therefrom as an input signal, the Schmitt trigger having first ad second threshold values defining a hysteresis input to the Schmitt trigger, the Schmitt trigger configured and arranged to switch an output signal between the first and second output values as a function of the input signal and the first and second threshold values, wherein the output is the first output level when the input exceeds the second threshold level, in a positive sense, and the output is the second output level when the input exceeds the first threshold level, in a negative sense, and wherein the Schmitt trigger maintains the previous output when the input is between the first and second thresholds;
   wherein the fixed resistor is connected in series between the output of the Schmitt trigger and the first terminal of the sensing capacitor, wherein the first and second relaxation times are a function of the capacitance of the sensor capacitor and the resistance of the fixed resistor;
   whereby the output signal of the Schmitt trigger has first and second values, wherein the output of the Schmitt trigger is the first value for the first relaxation time and the output of the Schmitt trigger is the second value for a second relaxation time, and wherein the sum of the first relaxation time and the second relaxation time is proportional to the first capacitance.

20. The circuit of claim 19 wherein the Schmitt trigger includes a comparator having a positive input and a negative input and an output, wherein the input of the Schmitt trigger is the negative input, the Schmitt trigger further including a first resistor connected in series between the output and the positive input and a second resistor connected between the positive input and the voltage reference point, wherein the first and second resistors are selected to provide the first and second threshold values corresponding to the first and second output levels respectively.

21. The circuit of claim 17 wherein the first amplifier includes an operational amplifier configured as a non-inverting unity gain amplifier.

22. The circuit of claim 21 wherein the first amplifier includes an operational amplifier and first and second resistors configured as a non-inverting amplifier in which the first and second resistors provide feedback form the output of the operational amplifier and the negative input, the non-inverting amplifier further including a feedback capacitor coupled between the output of the operational amplifier and the positive input.

23. The circuit of claim 22 further including a guard electrode coaxially surrounding the fixed resistor and proximate thereto, the guard being electrically coupled to the output of the first amplifier.

24. The circuit of claim 23 wherein the guard electrode further surrounds the input of the first amplifier.

25. A system for sensing the value of the mutual capacitance between a sensor capacitor and a target, the circuit comprising:
   a sensing capacitor having a sensing capacitance value, the sensing capacitor having first and second terminals, the second terminal coupled to a voltage reference point;
   a first amplifier having an input and an output, the input connected to the first terminal of the sensing capacitor, the amplifier providing an output signal that is proportional to the input signal;
   a relaxation oscillator coupled to the first amplifier and receiving the output signal therefrom, the relaxation oscillator including the sensing capacitor and the first amplifier, the relaxation oscillator having an output including first and second values, wherein the output of the relaxation oscillator is the first value for a first relaxation time and the output of the relaxation oscillator is the second value for a second relaxation time, and wherein the sum of the first relaxation time and the second relaxation time is proportional to the sensing capacitance value;
   a fixed resistor connected in series between the output of the relation oscillator and the first terminal of the sensing capacitor, wherein the first and second relaxation times are a function of the capacitance of the sensor capacitor and the resistance of the fixed resistor;
   a resistance multiplying circuit of configured and arranged to multiply the value of the fixed resistor by a predetermined constant; a timing module coupled to the relaxation oscillator and configured and arranged to measure the first and second relaxation times and to provide a total relaxation time that is the sum of the first and second relaxation times;

a calculation module coupled to the timing module and configured and arranged to calculate the first capacitance by multiplying the total relaxation time by a predetermined constant.

26. The circuit of claim 25 wherein the resistance multiplying circuit includes the first amplifier including an operational amplifier configured and arranged as a unity gain amplifier having an output and an input, the multiplying circuit further including first and second resistors coupled in series between the output of the relaxation oscillator and the output of the operational amplifier, the fixed resistor coupled to the series connection between the first and second resistors.

27. The circuit of claim 25 wherein the relaxation oscillator includes:

a Schmitt trigger having an input coupled to the output of the first amplifier and receiving the output signal therefrom as an input signal, the Schmitt trigger having first and second threshold values defining a hysteresis input to the Schmitt trigger, the Schmitt trigger configured and arranged to switch an output signal between the first and second output values as a function of the input signal and the first and second threshold values, wherein the output is the first output level when the input exceeds the second threshold level, in a positive sense, and the output is the second output level when the input exceeds the first threshold level, in a negative sense, and wherein the Schmitt trigger maintains the previous output when the input is between the first and second thresholds;

wherein the fixed resistor is connected in series between the output of the Schmitt trigger and the first terminal of the sensing capacitor, wherein the first and second relaxation times are a function of the capacitance of the sensor capacitor and the resistance of the fixed resistor;

whereby the output signal of the Schmitt trigger has first and second values, wherein the output of the Schmitt trigger is the first value for the first relaxation time and the output of the Schmitt trigger is the second value for a second relaxation time, and wherein the sum of the first relaxation time and the second relaxation time is proportional to the first capacitance.

28. The circuit of claim 27 wherein the Schmitt trigger includes a comparator having a positive input and a negative input and an output, wherein the input of the Schmitt trigger is the negative input, the Schmitt trigger further including a first resistor connected in series between the output and the positive input and a second resistor connected between the positive input and the voltage reference point, wherein the first and second resistors are selected to provide the first and second threshold values corresponding to the first and second output levels respectively.

29. The circuit of claim 25 wherein the first amplifier includes an operational amplifier configured as a non-inverting unity gain amplifier.

30. The circuit of claim 29 wherein the first amplifier includes an operational amplifier and first and second resistors configured as a non-inverting amplifier in which the first and second resistors provide feedback form the output of the operational amplifier and the negative input, the non-inverting amplifier further including a feedback capacitor coupled between the output of the operational amplifier and the positive input.

31. The circuit of claim 30 further including a guard electrode coaxially surrounding the fixed resistor and proximate thereto, the guard being electrically coupled to the output of the first amplifier.

32. The circuit of claim wherein the guard electrode further surrounds the input of the first amplifier.

* * * * *

UNITED STATES PATENT AND TRADEMARK OFFICE
CERTIFICATE OF CORRECTION

PATENT NO. : 6,700,392 B2
DATED : March 2, 2004
INVENTOR(S) : Wayne C. Haase

It is certified that error appears in the above-identified patent and that said Letters Patent is hereby corrected as shown below:

Column 5,
Lines 54 and 57, "$Va_{tha}$" should read -- $V_{tha}$ --;
Line 64, "106" should read -- 104 --;

Column 6,
Line 60, "$C_f (R1/R2)$, where $C_f$" should read -- $C_f (R1/R2)$, where $C_f$ --;

Line 63, "$C_f$" should read -- $C_f$ --;

Column 13,
Line 6, "facto s" should read -- factors --;
Line 8, "tar et," should read -- target, --;
Line 36, delete "of";
Line 53, "ad" should read -- and --;

Column 14,
Line 66, delete "of"; and

Column 16,
Line 36, "claim" should read -- claim 31 --.

Signed and Sealed this

Eleventh Day of January, 2005

JON W. DUDAS
*Director of the United States Patent and Trademark Office*